United States Patent [19]

Smith

[11] Patent Number: 5,786,729
[45] Date of Patent: Jul. 28, 1998

[54] STABLE BIAS CURRENT CIRCUIT FOR OPERATIONAL AMPLIFIER

[75] Inventor: Douglas L. Smith, Tucson, Ariz.

[73] Assignee: Burr-Brown Corporation, Tucson, Ariz.

[21] Appl. No.: 710,632

[22] Filed: Sep. 18, 1996

Related U.S. Application Data

[60] Provisional application No. 60/017,143 Sep. 21, 1995.
[51] Int. Cl.$^6$ .................................................. H03F 1/14
[52] U.S. Cl. .................................................. 330/255; 330/292
[58] Field of Search .................................. 330/255, 257, 330/261, 288, 292, 267

[56] References Cited

U.S. PATENT DOCUMENTS

5,418,495  5/1995  Harvey ............................... 330/292 X
5,654,671  8/1997  Murray ............................... 330/255

*Primary Examiner*—Steven Mottola
*Attorney, Agent, or Firm*—Cahill, Sutton & Thomas P.L.C.

[57] ABSTRACT

A compensated bias current circuit for use in an operational amplifier including a differential input stage, a gain stage, and an output driver stage. The compensated bias current circuit includes a PNP current mirror control transistor having an emitter coupled to a first supply voltage conductor, a collector coupled by a first conductor to a first terminal of a current source circuit, and a base connected to a second conductor, with the second conductor connected to first and second PNP current mirror output transistors in the gain stage and a third PNP current mirror output transistor in the output driver stage. The compensated bias current circuit also includes an NPN current mirror control transistor having an emitter coupled to a second supply voltage conductor and a collector and base coupled by a third conductor to a second terminal of the current source circuit, a first NPN current mirror output transistor in the differential input stage, and a second NPN current mirror output transistor in the output driver stage. A single compensation capacitor is connected between the first conductor and the third conductor. The compensation circuit compensates instability in the PNP and NPN current mirrors and also provides balanced responses of the PNP and NPN current mirror to "glitches" in the power supply.

20 Claims, 7 Drawing Sheets

STABLE BIAS CURRENT CIRCUIT FOR OPERATIONAL AMPLIFIER

CROSS REFERENCE TO RELATED APPLICATION

This application claims the benefit of prior filed co-pending U.S. Provisional Application Ser. No. 60/017,143, which was converted to a provisional application from Utility Application Ser. No. 08/531,633, filed Sep. 21, 1995.

BACKGROUND OF THE INVENTION

The invention relates to bias current circuits for a high speed operational amplifier, and particularly to an efficient, low capacitance circuit configuration including a single compensation capacitor that results in balanced response of PNP current mirror circuits and NPN current mirror circuits within the operational amplifier.

High speed amplifiers are sensitive to high frequency noise disturbance because the internal parasitics, which would be large enough in slower amplifiers to attenuate the noise, are very much reduced and consequently allow the noise signals to pass. These amplifiers are also sensitive to high frequency noise disturbance because the high bandwidth of the active elements amplifies the noise signals.

The applications of high speed amplifiers expose them to high frequency noise disturbance coupled by stray circuit parasitics into power supply conductors and other circuit connections. The amplifiers also generate high frequency noise disturbance on internal connections as they respond to large signal high frequency input signals.

Figure 1:
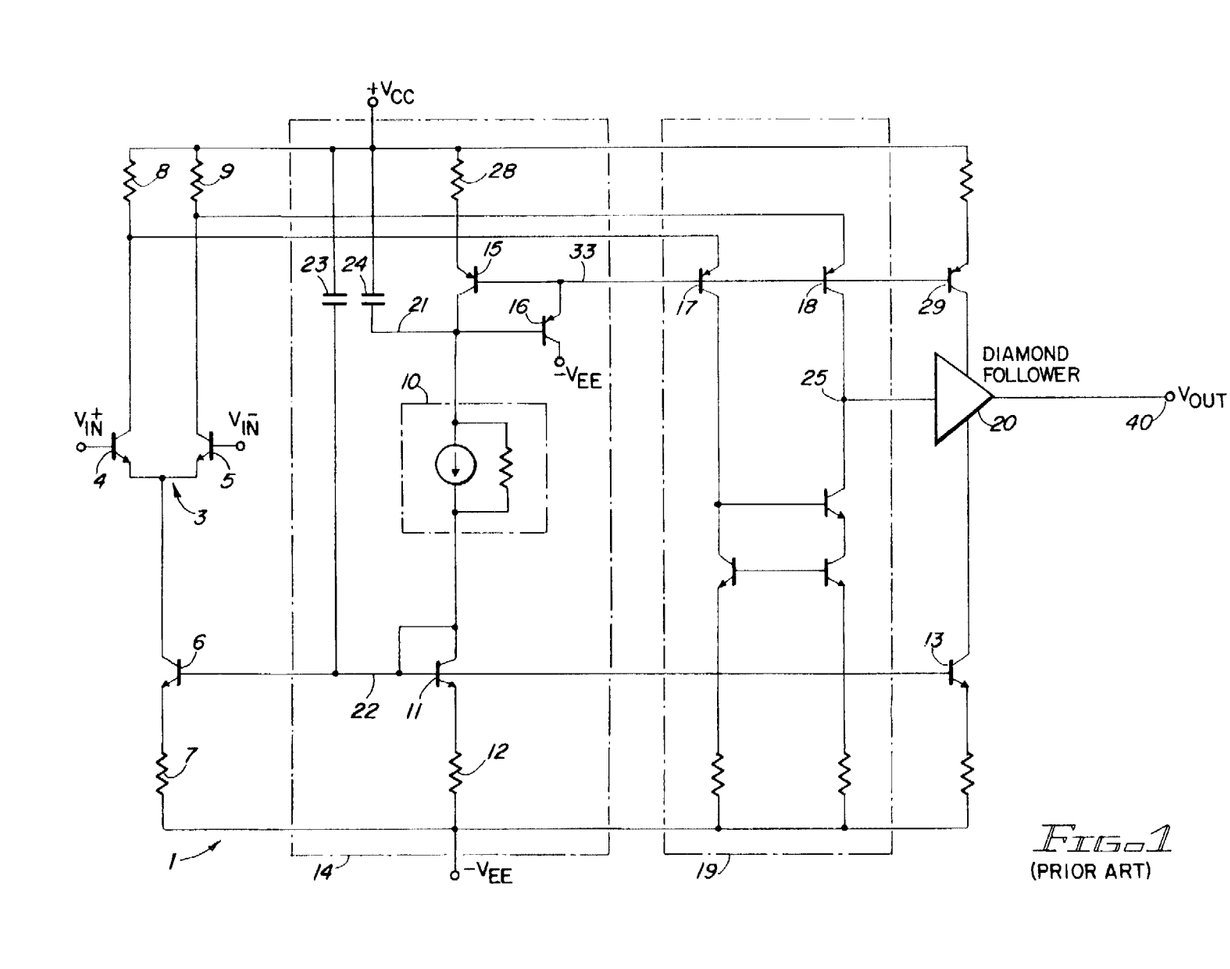
FIG. 1 is a schematic circuit diagram of an operational amplifier which constitutes the closest prior art to the present invention.

FIG. 1 is a simplified schematic diagram of an OPA646 wide bandwidth operational amplifier marketed by Burr-Brown Corporation of Tucson, Ariz. which is believed to be the closest prior art to the present invention. The operational amplifier 1 of FIG. 1 includes a differential input stage 3 including NPN input transistors 4 and 5. The differential input signal is applied between the bases of input transistors 4 and 5. The emitters of input transistors 4 and 5 are connected to an NPN current mirror output transistor 6, the emitter of which is coupled through a low value resistor 7 to the negative power supply voltage $-V_{EE}$. $-V_{EE}$ typically is $-5$ volts. The collectors of input transistors 4 and 5 are coupled by load resistors 8 and 9, respectively, to the positive supply voltage $+V_{CC}$, which typically is $+5$ volts. The collectors of input transistors 4 and 5 also are coupled to the emitters of PNP "folded cascode" transistors 17 and 18 included in gain stage 19. The output 25 of gain stage 19 is coupled to the input of a diamond follower unity gain buffer 20 which produces an output $V_{OUT}$ on conductor 40.

The bases of PNP "folded cascode" transistors 17 and 18 are connected by conductor 33 to the base of PNP current mirror control transistor 15. The emitter of PNP current mirror control transistor 15 is connected through a low value resistor 28 to the positive power supply voltage $+V_{CC}$. The base of PNP current mirror control transistor 15 also is connected to the emitter of a PNP "darlington" transistor 16, the base of which is connected by conductor 21 to the collector of PNP transistor 15 and to one terminal of a current source circuit 10. (Current source 10 includes a resistor schematically drawn to represent the impedance thereof.) The "darlington" transistor 16 is needed to reduce error in the PNP current source output transistor collector currents due to the low beta of PNP transistors manufactured using typical "high speed" bipolar manufacturing processes. Conductor 21 also is connected to one terminal of a 1.5 picofarad compensation capacitor 24, the other terminal of

2 which is connected to $+V_{CC}$. Conductor 33 also is connected to the base of a PNP current mirror output transistor 29 to establish operating current for diamond follower 20.

The collectors of PNP folded cascode transistors 17 and 18 are connected to other circuitry in gain stage circuit 19 which produces an output signal on conductor 25 that is applied to the input of diamond follower unity gain buffer 20.

An NPN current mirror control transistor 11 has its collector and base connected by conductor 22 to a second terminal of current source 10, and also to one terminal of a second compensation capacitor 23 having its other terminal connected to $+V_{CC}$. Conductor 22 also is connected to the base of NPN current mirror output transistor 6 and to the base of an NPN current mirror output transistor 13 which establishes operating current for diamond follower 20. A low value resistor 12 is connected between the emitter of NPN current source control transistor 11 and $-V_{EE}$. The emitters of transistors 6 and 13 are also connected by low value resistors to $-V_{EE}$.

Those skilled in the art know that transient imbalances between the constant currents produced in the collectors of the NPN current mirror output transistors 6 and 13 and the collectors of PNP current mirror output transistors 17, 18 and 29 can produce undesirable transient signal operation of the operational amplifier 1 that results in "ringing" of the output voltage $V_{OUT}$ produced on conductor 40 when it rapidly swings or "slews" toward the $+V_{CC}$ level or the $-V_{EE}$ level. Those skilled in the art also realize that PNP "darlington" transistor 16 and PNP current mirror control transistor 15 form a loop which may oscillate at high frequencies. Therefore, compensation capacitor 24 needs to have a sufficiently high value to prevent such oscillating. In the OPA646 operational amplifier of FIG. 1, the value of the capacitance of compensation capacitor 24 is 1.5 picofarads.

Also, noise or "glitches" on the $+V_{CC}$ power supply conductor can cause imbalances in the voltages on conductors 21 and 22 by coupling unequal amounts of noise energy thereto, resulting in imbalances between the currents in the collectors of the various PNP current mirror output transistors and the currents in the collectors of the various NPN current mirror output transistors, especially if compensation capacitors 23 and 24 are mismatched. Those skilled in the art know that provision of compensation capacitors such as 23 and 24 on an integrated circuit requires much more chip area than is desirable, thereby increasing the size of the chip, increasing its cost, and sometimes decreasing its speed and manufacturing yield.

SUMMARY OF THE INVENTION

Accordingly, it is an object of the invention to provide a stable bias current circuit in a high speed integrated circuit operational amplifier which requires substantially less chip area in the operational amplifier than the closest prior art.

It is another object of the invention to provide a bias current circuit for an operational amplifier which reduces transient imbalances in the currents in the collectors of PNP current mirror output transistors and NPN current mirror output transistors of the operational amplifier.

It is another object of the invention to provide a bias current circuit of the type described in an operational amplifier, which bias current circuit minimizes recovery time for "ringing" of the output voltage of the operational amplifier when the output voltage undergoes a fast transition toward a power supply voltage level.

Briefly described, and in accordance with one embodiment thereof, the invention provides a compensated bias

3 current circuit for use in an operational amplifier which includes a differential input stage, a gain stage, and an output driver stage. The compensated bias current circuit includes a PNP current mirror control transistor having an emitter coupled to a first supply voltage conductor, a collector coupled by a first conductor to a first terminal of a current source circuit, and a base connected to a second conductor. The second conductor is connected to first and second PNP current mirror output transistors in the gain stage and a third PNP current mirror output transistor in the output driver stage. In the described embodiment, a PNP darlington transistor has an emitter connected to the second conductor and a base connected to the first conductor. An NPN current mirror control transistor has an emitter coupled to a second supply voltage conductor and a collector and base coupled by a third conductor to a second terminal of the current source circuit, a first NPN current mirror output transistor in the differential input stage, and a second NPN current mirror output transistor in the output driver stage. A single compensation capacitor is coupled between the first conductor and the third conductor and operates to compensate a feedback loop including the base-emitter junctions of the PNP darlington transistor and the PNP current mirror control transistor, and provides the same (or improved) performance achieved by use of both compensation capacitors 23 and 24 in the closest prior circuit shown in FIG. 1.

BRIEF DESCRIPTION OF THE DRAWINGS

FIG. 4B is a simulated graph of $V_{OUT}$ versus time for the circuit of FIG. 2 in response to ±25% perturbation in the

4 current flowing into the +$V_{CC}$ conductor with capacitor 45 omitted and two capacitors 23 and 24 connected as in prior art FIG. 1 each having a capacitance of 0.6 picofarads.

DETAILED DESCRIPTION OF THE PREFERRED EMBODIMENTS

Figures 2, 2C:
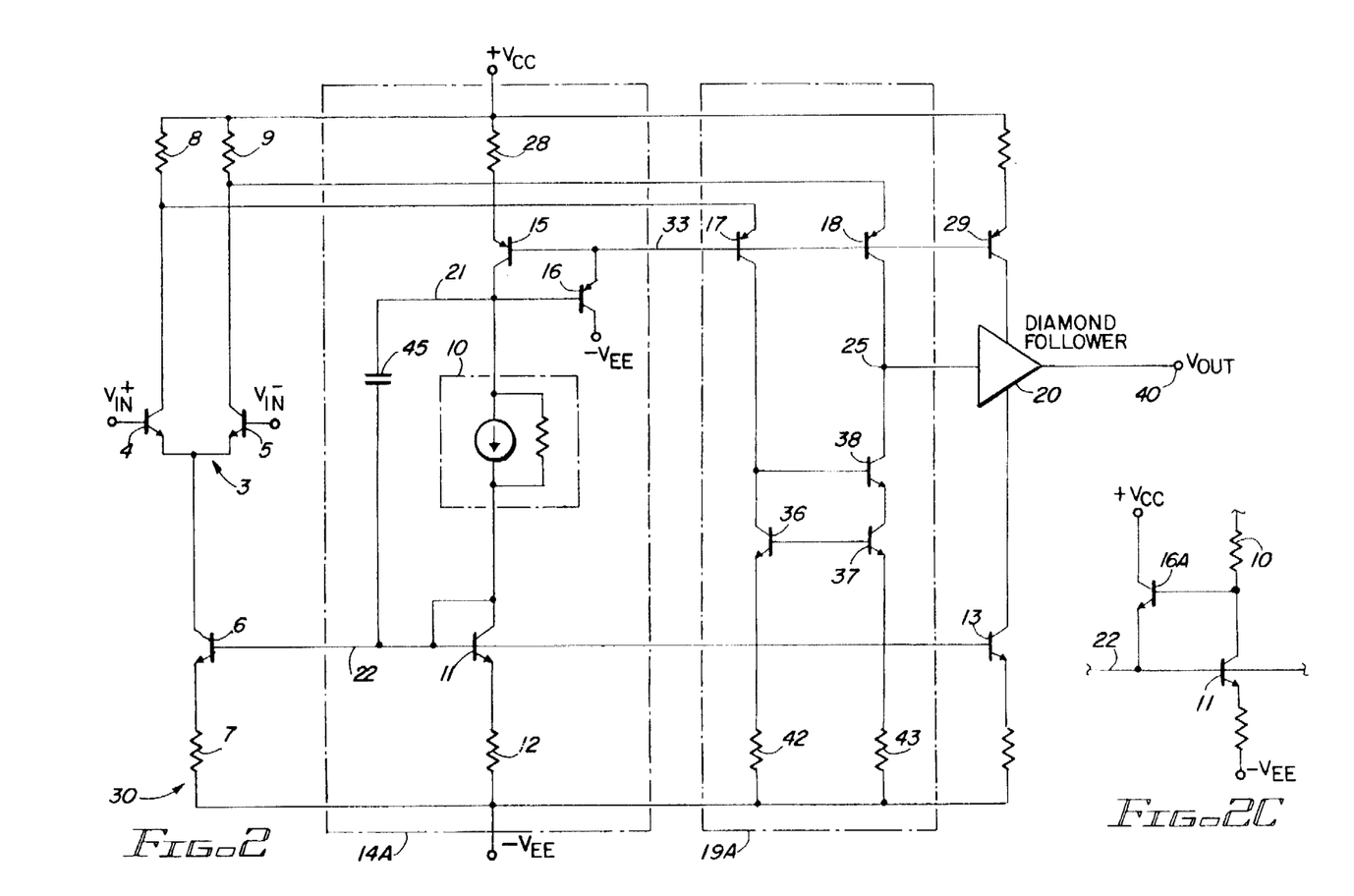
FIG. 2 is a schematic diagram of a presently preferred embodiment of the present invention.
FIG. 2C is a schematic drawing illustrating how an NPN darlington transistor 16A can be coupled to NPN current mirror control transistor 11 in the circuit of FIG. 2A.
Figure 2A:
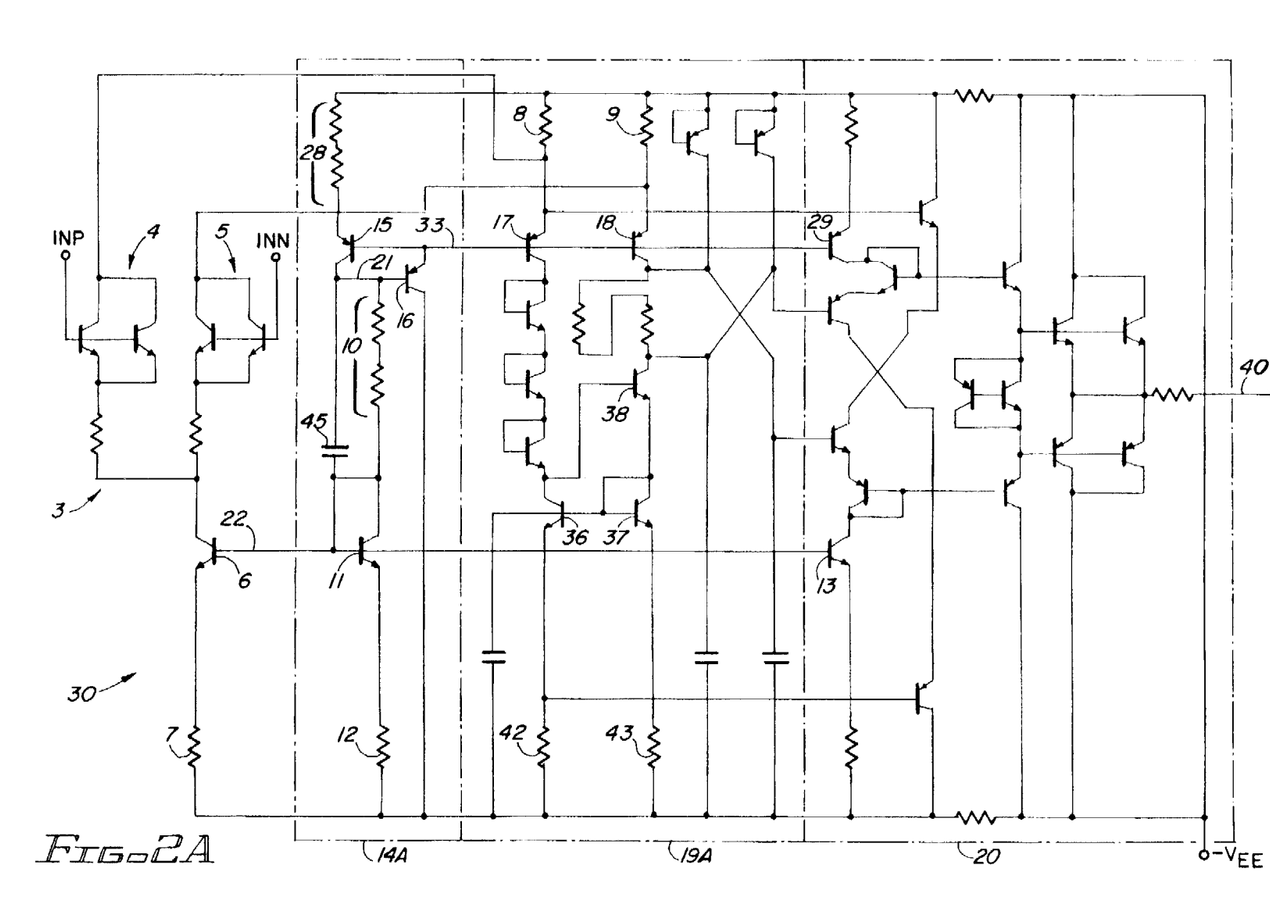
FIG. 2A is a complete detailed circuit schematic diagram of the Burr-Brown OPA650 operational amplifier shown in FIG. 2.

The present invention is embodied in the circuit of FIG. 2, which is a simplified schematic diagram of the Burr-Brown OPA650 operational amplifier, recently introduced to the market. FIG. 2A is a detailed schematic diagram of the same circuit, and is included for completeness of disclosure, using the same reference numerals as in FIG. 2. In FIGS. 2 and 2A, operational amplifier 30 includes an input stage 3 that is essentially identical to differential input stage 3 of prior art FIG. 1. (Note that where suitable, the same or similar reference numerals used in FIG. 1 also are used in FIGS. 2 and 2A to identify similar or identical components.) Operational amplifier 30 also includes a bias current circuit 14A.

Bias current source circuit 14A includes a PNP current mirror control transistor 15 biased by PNP "darlington" transistor 16 in the same manner as in FIG. 1. As in FIG. 1, resistor 28 is connected between the emitter of PNP current mirror control transistor 15 and +$V_{CC}$. (However, in some cases darlington transistor 16 could be omitted.) As in FIG. 1, the collectors of NPN input transistors 4 and 5 are connected to the emitters of PNP "folded cascode" transistors 17 and 18. Two-terminal constant current source 10 (which can be a simple resistor or a more complex circuit) is connected between the collector of PNP current mirror control transistor 15 and the collector of NPN current mirror control transistor 11, as in FIG. 1.

However, 1.5 picofarad compensation capacitors 23 and 24 of prior art FIG. 1 are omitted from the operational amplifier of FIGS. 2 and 2A. Instead, and in accordance with the present invention, a compensation capacitor 45 (which can have a capacitance of 0.6 picofarads) is connected between conductor 21 and conductor 22.

In FIG. 2, numeral 19A indicates a gain circuit which, in effect, produces an output signal that is applied via conductor 25 to the bases of a pair of input transistors of a conventional diamond follower unity gain buffer circuit 20A. Since diamond follower 20A is conventional, it is not described in detail, although for completeness its schematic diagram is included in FIG. 2A.

The operational amplifier circuit 30 of the present invention requires substantially less chip area than the prior art circuit shown in FIG. 1 because the required capacitance (0.6 picofarad) of single compensation capacitor 45 is substantially less than the total 3.0 picofarads of capacitance of compensation capacitors 23 and 24 of the prior art circuit 1 of FIG. 1. In fact, even if the total capacitance of capacitors 23 and 24 of the prior art circuit of FIG. 1 could substantially reduced without seriously diminishing circuit performance, the use of the single compensation capacitor 45 is beneficial, because it results in more stable circuit operation. Furthermore, power supply "noise" or "glitches" in the operational amplifier of FIGS. 2 and 2A couple equal amounts of current into conductors 21 and 22. This results from a single compensation capacitor as in FIGS. 2 and 2A being connected to conductors 21 and 22 so as to carry the same current in both terminals, instead of having two separate capacitors as in FIG. 1, which may have different currents due to capacitance mismatches and due to differences in the impedances at conductors 21 and 22. Furthermore, feedback noise is coupled equally by single compensation capacitor 45 to the base electrodes of both PNP current mirror control transistor 15 and the NPN current mirror control transistor 11.

Therefore, approximately balanced PNP and NPN current mirror responses to such "glitches" are achieved. This can result in shorter recovery times for operational amplifier 30 of FIGS. 2 and 2A than is the case for the prior art operational amplifier 1 of FIG. 1.

Figure 3A:
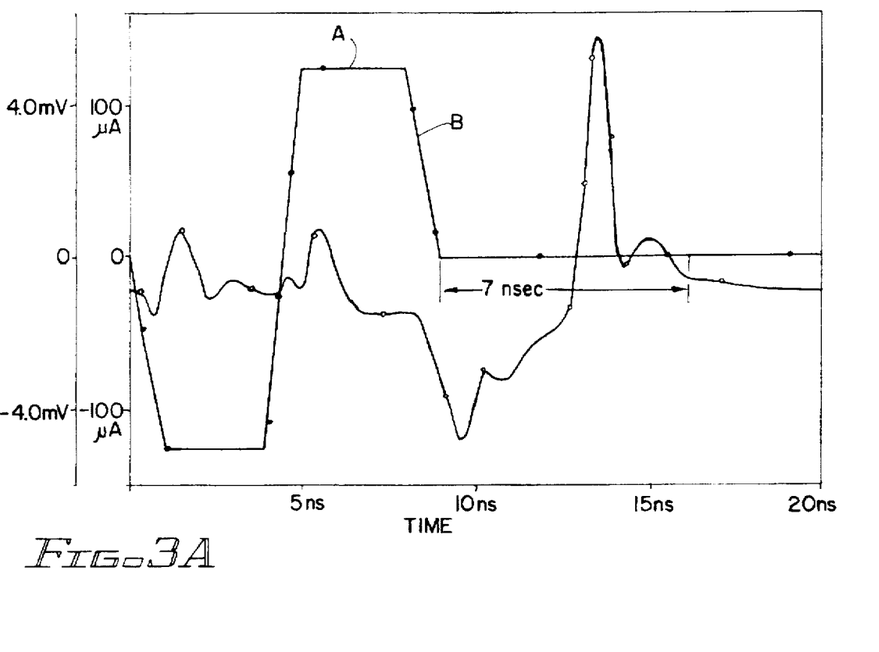
FIG. 3A is a simulated graph of $V_{OUT}$ versus time in response to ±25% perturbations in the current flowing into the conductor 33 connected to the base of PNP transistor 15 in the circuit of the present invention as shown in FIG. 2 with capacitor 45 having a capacitance of 0.6 picofarads.

FIG. 3A shows a simulated graph of $V_{OUT}$ versus time for the circuit of FIGS. 2 and 2A, and FIGS. 3B and 3C show simulated graphs of $V_{OUT}$ versus time when capacitor 45 is omitted and instead the two capacitors 23 and 24 are connected as in the prior art circuit of FIG. 1. This allows a comparison between the use of the single capacitor 45 as in FIG. 2 and the use of two capacitors 23 and 24 as in prior art FIG. 1. For FIG. 3A, reference character A indicates the waveform of a simulated "noise" current source used in the computer simulation of the response of the circuit of FIG. 2 to ±25% perturbations in the current flowing into the bases of the PNP current mirror transistors. (The well known program SPICE was utilized to generate the simulated $V_{OUT}$ curves shown in FIGS. 3A–3C and 4A–4C.) The response of the circuit of FIGS. 2 and 2A to this simulated noise current source is significant because this type of noise could occur if $V_{OUT}$ on conductor 40 is stewing rapidly toward either the $+V_{CC}$ or $-V_{EE}$ voltage levels. The corresponding noise current variation on conductor 25 could be coupled by the collector-base capacitance of "folded cascode" transistor 18, causing current or charge to be "pumped" from conductor 25 into or out of conductor 33, and hence into or out of the bases of the PNP current mirror transistors. The graph of FIG. 3A shows that when the single compensation capacitor 45 is used as in FIG. 2, $V_{OUT}$ approaches a stable output level roughly 7 nanoseconds after the last noise current source transition indicated by character B.

Figure 3B:
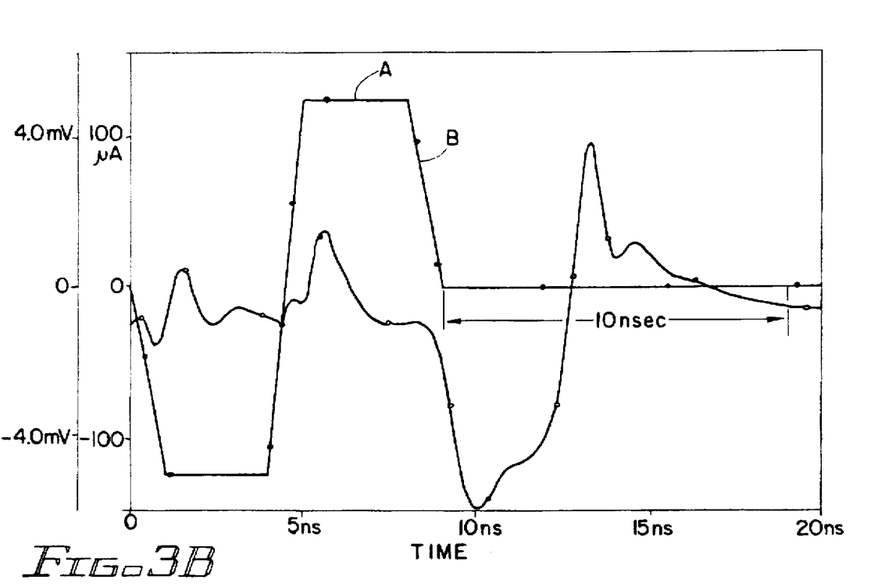
FIG. 3B is a simulated graph of $V_{OUT}$ versus time in response to ±25% perturbations in the current flowing into the conductor 33 connected to the base of PNP transistor 15 in FIG. 2 with capacitor 45 omitted and including two capacitors 23 and 24 connected as in prior art FIG. 1 each having a capacitance of 0.6 picofarads.

FIG. 3B shows the simulated $V_{OUT}$ response of the circuit of FIG. 2 to the same "noise current" source (waveform A) injected into the bases of the PNP current mirror transistors via conductor 33 when capacitor 45 is omitted and instead two compensation capacitors 23 and 24 are used as in prior art FIG. 1. It can be readily seen that $V_{OUT}$ in FIG. 3B has not settled as close as in FIG. 3A to its final level within 10 nanoseconds of the end of noise current transition B for the case when both capacitors 23 and 24 have values of 0.6 picofarads (and hence are perfectly matched).

Figure 3C:
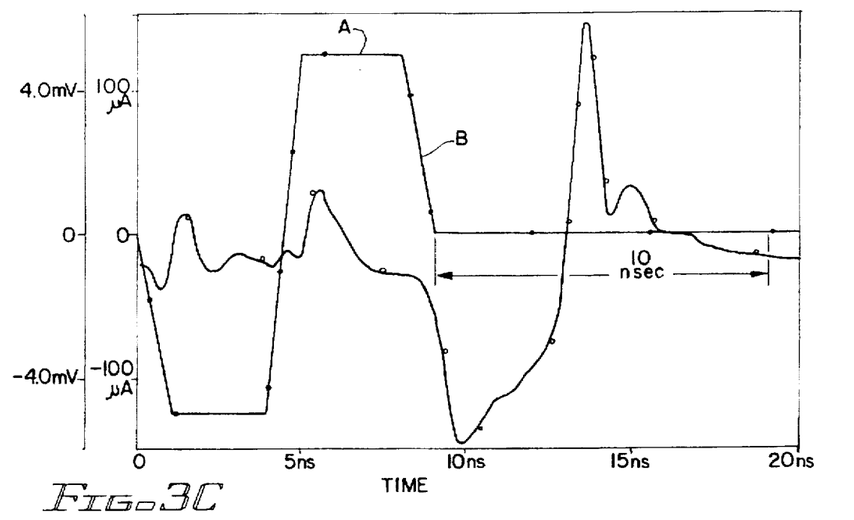
FIG. 3C is a simulated graph of $V_{OUT}$ versus time in response to ±25% perturbations in the current flowing into the conductor 33 connected to the base of PNP transistor 15 in FIG. 2 with capacitor 45 omitted and including two capacitors 23 and 24 connected as in prior art FIG. 1 each having a capacitance of 0.3 picofarads so the sum of capacitors 23 and 24 equals the value of capacitor 45.

FIG. 3C shows the simulated $V_{OUT}$ response of the circuit of FIG. 2 to the same "noise current source" (waveform A) injected into the bases of the PNP current mirror transistors via conductor 33 when capacitor 45 is omitted and instead two compensation capacitors 23 and 24 are connected as in prior art FIG. 1, wherein capacitors 23 and 24 are reduced in value to 0.3 picofarads so their sum is equal to the capacitance of the single capacitor 45 of FIG. 2 and FIG. 2A. Note that it is well known that capacitors in integrated circuits can occupy a significant part of the total chip area and that capacitor area is closely matched to the capacitance value thereof. It can be readily seen in FIG. 3C that $V_{OUT}$ has not settled as close to its final level within 10 nanoseconds of the end of noise current transition B.

Thus, the circuit of the present invention, with a single compensation capacitor 45, is much more stable in response to noise currents injected into or drawn out of the base of PNP current mirror control transistor 15 than the prior art circuit of FIG. 1 even if the two capacitors 23 and 24 thereof are perfectly matched. Even if capacitors 23 and 24 of the prior art circuit of FIG. 1 are reduced in value so their chip area corresponds to that of the present invention, much longer $V_{OUT}$ settling times nevertheless are required.

Figure 4A:
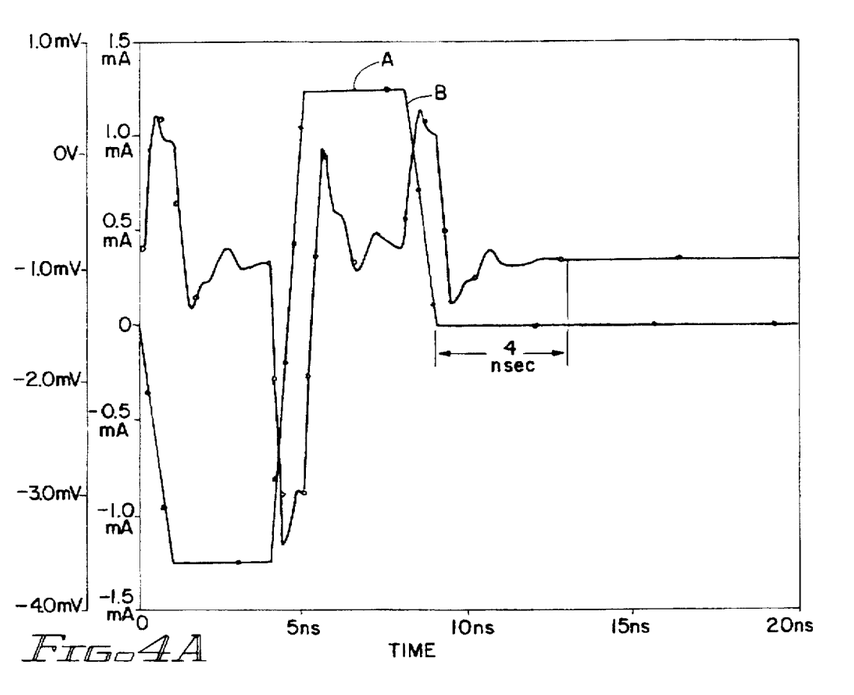
FIG. 4A is a simulated graph of $V_{OUT}$ versus time for the circuit of the present invention as shown in FIG. 2 in response to ±25% perturbations in the current flowing into the +$V_{CC}$ conductor, with capacitor 45 having a capacitance of 0.6 picofarads.
Figure 4B:
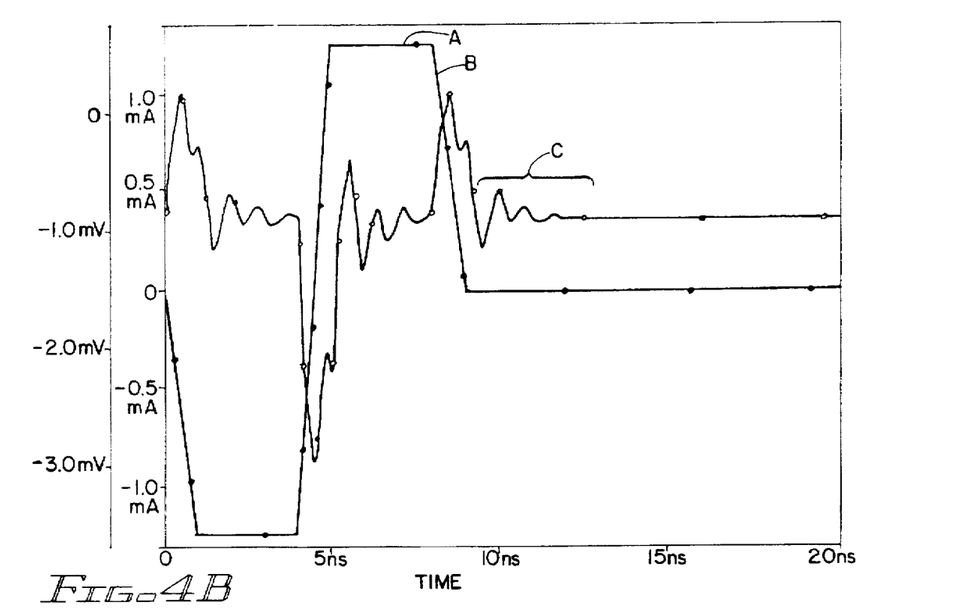
Figure 4C:
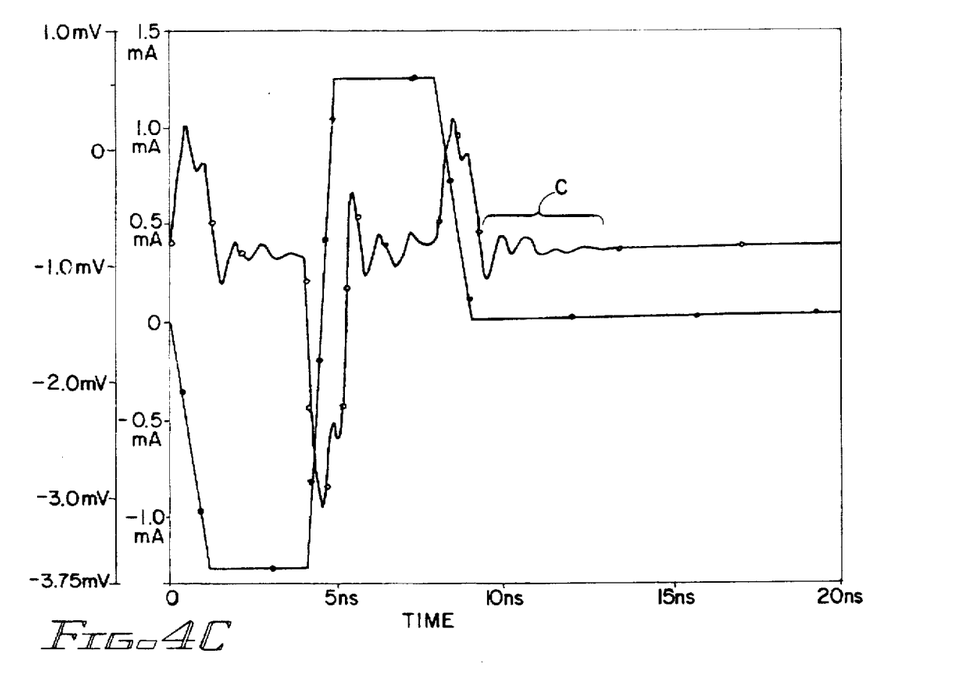
FIG. 4C is a simulated graph of $V_{OUT}$ versus time for the circuit of FIG. 2 in response to ±25% perturbations in the current flowing into the +$V_{CC}$ conductor with capacitor 45 omitted and two capacitors 23 and 24 connected as in prior art FIG. 1 each having a capacitance of 0.3 picofarads each so the sum is equal to the value of capacitor 45 of FIG. 2.

Similarly, FIG. 4A is a simulated graph of $V_{OUT}$ versus time in response to ±25% perturbations in the power supply current flowing into the $+V_{CC}$ conductor for the circuit of the present invention (FIGS. 2 and 2A). FIGS. 4B and 4C are simulated graphs of $V_{OUT}$ versus time with capacitor 45 omitted and instead two capacitors 23 and 24 are connected as in prior art FIG. 1. FIG. 4A shows $V_{OUT}$ settling close to a stable value by a time approximately 4 nanoseconds after the end of transition B of noise current waveform A, with the single compensation capacitor 45 having a capacitance of 0.6 picofarads. FIG. 4B shows that using the two compensation capacitors 23 and 24 connected as in prior art FIG. 1 (instead of compensation capacitor 45), with capacitors 23 and 24 perfectly matched at 0.6 picofarads each, results in $V_{OUT}$ being fairly stable approximately 4 nanoseconds after the end of the simulated noise current transition B. But in this case, as indicated by reference character C in FIG. 4B, $V_{OUT}$ tends to be very unstable as indicated by the three or four damped oscillation cycles. FIG. 4C shows the same tendency to instability if capacitors 23 and 24 both are reduced in value to 0.3 picofarads so their sum equals the 0.6 picofarad capacitance of single capacitor 45 of FIG. 2 (and hence occupy about the same amount of chip area).

Although the above described simulations of $V_{OUT}$ indicate about the same settling times for the particular semiconductor processing parameters used in the computer simulations, the oscillatory nature (indicated by C in FIGS. 4B and 4C) of the output of the circuit of FIG. 2 with capacitor 45 omitted and capacitors 23 and 24 of prior art FIG. 1 used instead shows that the use of two compensation capacitors 23 and 24 as in prior art FIG. 1 results in a much greater tendency to instability than the use of single compensation capacitor 45 in FIGS. 2 and 2A. Consequently, there is a much greater likelihood that temperature variations and/or variations in semiconductor processing operations could result in extended "undamped" oscillations if two compensation capacitors such as 23 and 24 in prior art FIG. 1 are used instead of a single capacitor 45 as in FIG. 2. The more stable operation shown in FIG. 4A achieved by means of the single compensation capacitor 45 of the present invention is highly desirable.

Figure 2B:
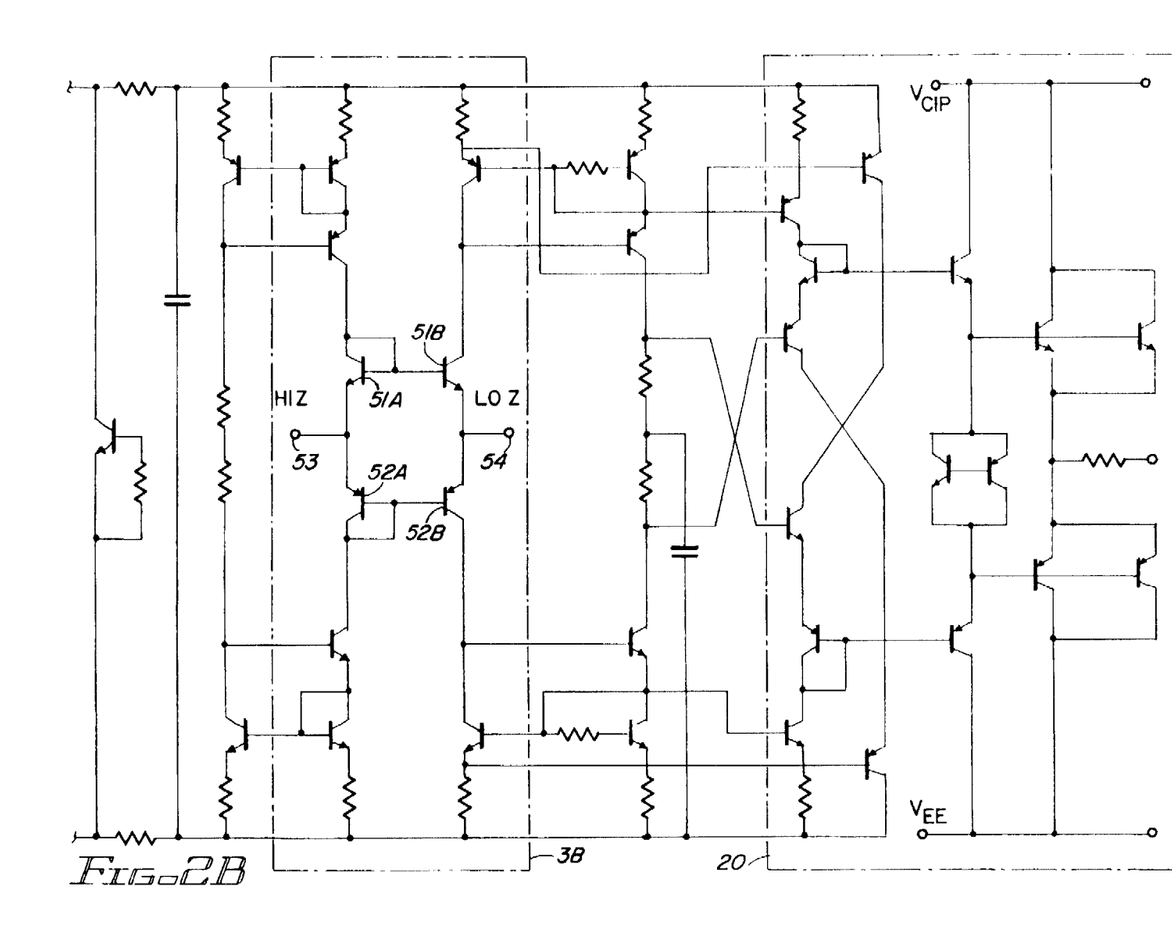
FIG. 2B is a complete detailed circuit schematic of the Burr-Brown OPA658 operational amplifier.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, although input stage 3 is shown as a differential stage with emitter-coupled transistors 4 and 5 which present high impedances to both $V_{IN}{}^+$ and $V_{IN}{}^-$ (and hence is suitable to receive "voltage feedback" from the output), the use of single compensation capacitor 45 is equally applicable when an input stage is used that presents a low impedance input which can receive "current feedback" rather than "voltage feedback". Diamond follower circuitry is commonly adapted to provide such an input stage. FIG. 2B illustrates a detailed schematic diagram of the Burr-Brown OPA658 high speed operational amplifier wherein the input stage 3B is designed to receive "current feedback", rather than "voltage feedback". The inverting input terminal 54 presents low impedance to a feedback signal, whereas the non-inverting input terminal 53 presents high input impedance. Those skilled in the art will recognize NPN transistors 51A and 51B and PNP transistors 52A and 52B, together with the current biasing circuitry illustrated, as a conventional diamond follower circuit. As another modification to the circuitry of FIGS. 2 and 2A, an NPN darlington transistor 16A could be connected as shown in FIG. 2C to NPN current mirror control transistor 11. This circuit would provide an internal feedback loop which would have to be compensated by compensation capacitance. Also, note that it is not essential that the same current source 10 provide the input current for both the PNP current mirror circuit 15,16 and the NPN current mirror circuit 11 as shown in FIG. 2. Instead, the first current source terminal 21 could be connected to a first current source, and the second current source terminal 22 could be connected to a second current source. Frequently, it is desirable to set a bias current string for an output stage of an operational amplifier to provide different temperature dependance than is required for the input stage. It may be desirable for the quiescent current flowing through the output stage to decrease with respect to temperature, in order to avoid the possibility of thermal runaway, while quiescent current for the input stage to increases with respect to increasing temperature in order to maintain the transconductance $g_m$ constant with respect to temperature.

What is claimed is:

1. A compensated bias current circuit in an operational amplifier including an input stage and an output driver stage, the compensated bias current circuit comprising in combination:
    (a) a PNP current mirror control transistor having an emitter coupled to a first supply voltage conductor, a collector coupled by a first conductor to a first current source terminal, and a base connected to a second conductor, the second conductor being connected to a base of at least one PNP current mirror output transistor;
    (b) an NPN current mirror control transistor having an emitter coupled to a second supply voltage conductor and a collector and a base coupled by a third conductor to a second current source terminal and at least one NPN current mirror output transistor; and
    (c) a compensation capacitor coupled between the first conductor and the third conductor, to compensate a PNP current mirror feedback loop including base-emitter junctions of the PNP current mirror control transistor and cause balanced responses of the PNP current mirror control transistor and the NPN current mirror control transistor to external noise signals and internal noise signals.

2. The compensated bias current circuit of claim 1 including a current source circuit including the first and second current source terminals.

3. A compensated bias current circuit for use in an operational amplifier including a differential input stage and an output driver stage, the compensated bias current circuit comprising in combination:
    (a) a PNP current mirror control transistor having an emitter coupled to a first supply voltage conductor, a collector coupled by a first conductor to a first terminal of a current source circuit, and a base connected to a second conductor, the second conductor being coupled to bases of first and second PNP current mirror output transistors, respectively, an input of the output driver stage being coupled to a collector of the second PNP current mirror output transistor;
    (b) a PNP darlington transistor having an emitter connected to the second conductor and a base connected to the first conductor;
    (c) an NPN current mirror control transistor having an emitter coupled to a second supply voltage conductor and a collector and a base coupled by a third conductor to a second terminal of the current source circuit and a first NPN current mirror output transistor in the differential input stage; and
    (d) a compensation capacitor coupled between the first conductor and the third conductor, to compensate a feedback loop including base-emitter junctions of the PNP darlington transistor and the PNP current mirror control transistor and cause balanced responses of the PNP current mirror control transistor and the NPN current mirror control transistor to external noise signals and internal noise signals.

4. The compensated bias current circuit of claim 3 wherein the second conductor is connected to a third PNP current mirror output transistor in the output driver stage, and the third conductor is connected to a second NPN current mirror output transistor in the output driver stage.

5. The compensated bias current circuit of claim 3 wherein the emitter of PNP current mirror control transistor is coupled to the first supply voltage conductor by a first resistor.

6. The compensated bias current circuit of claim 5 wherein the differential input stage includes a first NPN input transistor having an emitter connected to a collector of the first NPN current mirror output transistor, and the differential input stage also includes a second NPN input transistor having an emitter connected to the emitter of the first NPN input transistor, the differential input stage further including first and second load resistors coupled between the first supply voltage conductor and collectors of the first and second NPN input transistors, respectively, emitters of the first and second PNP current mirror output transistors being connected to the collectors of the first and second NPN input transistors, respectively.

7. The compensated bias current circuit of claim 6 wherein the emitter of the NPN current mirror control transistor is coupled to the second supply voltage conductor by a second resistor.

8. The compensated bias current circuit of claim 7 wherein an emitter of the first NPN current mirror output transistor is coupled to the second supply voltage conductor by a third resistor.

9. The compensated bias current circuit of claim 8 wherein the first and second PNP current mirror output transistors are included in a gain stage that further includes first, second and third NPN transistors and fourth and fifth resistors, the collector of the second PNP current mirror output transistor being coupled to the input of the output driver stage and a collector of the first NPN transistor, a collector of the first PNP current mirror output transistor being coupled to a base of the first NPN transistor and a collector of the second NPN transistor, a base of the second NPN transistor being coupled to a base and a collector of the third NPN transistor, an emitter of the second NPN transistor being coupled to the second supply voltage conductor by the fourth resistor, the collector of the third NPN transistor being coupled to an emitter of the first NPN transistor, an emitter of the third NPN transistor being coupled by the fifth resistor to the second supply voltage conductor.

10. The compensated bias current circuit of claim 9 including three level shifting diodes coupled in series between the collector of the first PNP current mirror output transistor and the collector of the second NPN transistor.

11. A method for compensating PNP and NPN current mirror circuitry in an operational amplifier including an input stage and an output driver stage, the method comprising the steps of:

(a) providing
   i. a PNP current mirror control transistor having an emitter coupled to a first supply voltage conductor, a collector coupled by a first conductor to a first current source circuit terminal, and a base connected to a second conductor, the second conductor being connected to a base of a PNP current mirror output transistor, an input of the output driver stage being coupled to a collector of the PNP current mirror output transistor,
   ii. an NPN current mirror control transistor having an emitter coupled to a second supply voltage conductor and a collector coupled by a third conductor to a second current source circuit terminal and an NPN current mirror output transistor;

(b) operating a single compensation capacitor coupled between the first conductor and the third conductor to compensate a feedback loop including a base-emitter junction of the PNP current mirror control transistor; and (c) operating the single compensation capacitor simultaneously with step (b) to cause balanced responses of the PNP current mirror control transistor and the NPN current mirror control transistor to external noise signals and internal noise signals, to thereby reduce instability of an output signal produced by the output driver stage in response to the external noise signals and the internal noise signals.

12. A bias current generator circuit in an amplifier circuit including an input stage and an output stage, the bias current generator circuit comprising in combination:

(a) a PNP current mirror circuit generating a first bias current in one of the input stage and output stage, the PNP current mirror circuit having a current input terminal;

(b) an NPN current mirror circuit generating a second bias current in one of the input stage and the output stage, the NPN current mirror circuit having a current input terminal, one of the PNP current mirror circuit and the NPN current mirror circuit including an internal feedback loop that requires capacitive compensation;

(c) current source circuitry connected to the current input terminals of the PNP current mirror circuit and the NPN current mirror circuit; and (d) a single compensation capacitor coupled between the current input terminals of the PNP current mirror circuit and the NPN current mirror circuit so as to compensate the internal feedback loop and cause balanced responses of the PNP current mirror circuit and the NPN current mirror circuit to external noise signals and internal noise signals.

13. The bias current generator circuit of claim 12 wherein the current source circuitry includes a single current source circuit connected between the current input terminals of the PNP current mirror circuit and the NPN current mirror circuit, respectively, to supply the same current to the PNP current mirror circuit and the NPN current mirror circuit.

14. The bias current generator circuit of claim 12 wherein the internal feedback loop is in the PNP current mirror circuit.

15. The bias current generator circuit of claim 12 wherein the internal feedback loop is in the NPN current mirror circuit.

16. The bias current generator circuit of claim 12 wherein the PNP current mirror circuitry generates the first bias current in the input stage.

17. The bias current generator circuit of claim 12 wherein the PNP current mirror circuitry generates the first bias current in the output stage.

18. The bias current generator circuit of claim 12 wherein the NPN current mirror circuitry generates the second bias current in the input stage.

19. The bias current generator circuit of claim 12 wherein the NPN current mirror circuitry generates the second bias current in the output stage.

20. A compensated bias current circuit in an operational amplifier including an input stage and an output driver stage, the compensated bias current circuit comprising in combination:

(a) A PNP current mirror control transistor having an emitter coupled to a first supply voltage conductor, a collector coupled by a first conductor to a first current source terminal, and a base connected to a second conductor, the second conductor being coupled to a base of at least one PNP current mirror output transistor;

(b) an NPN current mirror control transistor having an emitter coupled to a second supply voltage conductor and a collector and a base coupled by a third conductor to a second current source terminal and at least one NPN current mirror output transistor; and (c) a compensation capacitor coupled between the first conductor and the third conductor, to cause balanced responses of the PNP current mirror control transistor and the NPN current mirror control transistor to external noise signals and internal noise signals.

* * * * *